United States Patent
Parris et al.

(10) Patent No.: US 6,501,817 B2
(45) Date of Patent: Dec. 31, 2002

(54) AREA EFFICIENT REDUNDANCY MULTIPLEXER CIRCUIT TECHNIQUE FOR INTEGRATED CIRCUIT DEVICES PROVIDING SIGNIFICANTLY REDUCED PARASITIC CAPACITANCE

(75) Inventors: Michael Parris, Colorado Springs, CO (US); Kim Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/010,336

(22) Filed: Nov. 13, 2001

(65) Prior Publication Data

US 2002/0041198 A1 Apr. 11, 2002

Related U.S. Application Data

(63) Continuation-in-part of application No. 09/648,845, filed on Aug. 25, 2000.

(51) Int. Cl.⁷ ................................................ G06M 3/00
(52) U.S. Cl. ............................. 377/68; 377/26; 377/54; 377/75; 365/200; 365/201; 714/718; 714/805
(58) Field of Search ............................. 377/26, 54, 68, 377/75; 365/200, 201; 714/718, 805

(56) References Cited

U.S. PATENT DOCUMENTS

| | | | |
|---|---|---|---|
| 4,620,117 A | 10/1986 | Fang | 326/113 |
| 4,719,627 A * | 1/1988 | Peterson et al. | 371/38 |
| 5,744,995 A | 4/1998 | Young | 327/407 |
| 5,818,258 A | 10/1998 | Choi | 326/83 |
| 5,825,235 A | 10/1998 | Oh | 327/408 |
| 5,909,141 A | 6/1999 | Tomishima | 327/536 |
| 5,936,426 A | 8/1999 | Wilson et al. | 327/408 |

* cited by examiner

Primary Examiner—Margaret R. Wambach
(74) Attorney, Agent, or Firm—William J. Kubida; Peter J. Meza; Hogan & Hartson LLP

(57) ABSTRACT

An improved integrated circuit area efficient redundancy multiplexer circuit technique provides similar functionality to conventional CMOS transmission, or "pass" gates while concomitantly reducing circuit complexity, the die area necessary to support redundant elements and complementary control signals in memory device ICs and undesired parasitic capacitance. The technique of the present invention effectuates this end by utilizing the on-chip boosted voltage levels ($V_{pp}$) which are generally available in integrated circuit memory devices to supply the voltage for the control signal applied to a single N-channel transistor pass gate instead of the conventional supply voltage level of $V_{cc}$. The $V_{pp}$ voltage and circuit ground ("GND") are then utilized as the logic "high" and "low" signal levels respectively. This use is made possible due to the fact that these control signals operate at a direct current ("DC") level after device power-up. When the integrated circuit has powered-up and is stabilized (and after the redundancy has been programmed), the signal levels of the single transistor N-channel pass gates are stabilized. The significant reduction in undesired parasitic capacitance that is also provided allows for higher throughput speeds in the address and data paths.

20 Claims, 6 Drawing Sheets

AREA EFFICIENT REDUNDANCY MULTIPLEXER CIRCUIT TECHNIQUE FOR INTEGRATED CIRCUIT DEVICES PROVIDING SIGNIFICANTLY REDUCED PARASITIC CAPACITANCE

RELATED APPLICATION

The present application is a continuation-in-part of U.S. patent application Ser. No. 09/648,845 filed Aug. 25, 2000, assigned to United Memories, Inc., Colorado Springs, Colo. and Sony Corporation, Shinagawa-ku, Tokyo, Japan, assignees of the present invention, the disclosure of which is herein specifically incorporated by this reference.

BACKGROUND OF THE INVENTION

The present invention relates, in general, to the field of integrated circuit ("IC") devices. More particularly, the present invention relates to an improved, integrated circuit area efficient, redundancy multiplexer circuit technique providing significantly reduced parasitic capacitance of particular applicability for use in integrated circuit memory devices and other semiconductor devices incorporating embedded memory elements.

Current integrated circuit memory redundancy technology often utilizes numbers of conventional, complementary metal oxide semiconductor ("CMOS") transmission, or "pass" gates for each repairable element, with each such pass gate comprising parallel coupled N-channel and P-channel transistors controlled by complementary gate control signals. Functionally, these pass gates are often utilized for shifting addresses as well as the read/write data of redundant circuit elements.

For example, the address path of regular as well as spare row and column elements (and the data flow of a data path) can be directed through the use of pass gate logic. In the conventional CMOS implementation of a pass gate, the input signals can be propagated without a threshold voltage ("$V_t$") drop in the signal level as would be the case if only a single N-channel or P-channel transistor were used instead. In the former instance, the N-channel device would introduce a $V_t$ drop to logic "one" signal levels and in the latter case, the P-channel device would introduce a $V_t$ drop to logic "zero" signal levels.

Although CMOS pass gates designs are traditionally well suited for these purposes, the layout of such circuits nevertheless consumes an undesirably large amount of integrated circuit die ("on-chip") area and adds concomitant circuit complexity with the need for complementary control signal generation, routing and other attendant requirements. This additional die space and layout complexity adds to an increased device cost and design time while also exhibiting a significantly large parasitic capacitance, leading to a decrease in the speed of the address and data paths. Further, while single device pass gates circuit techniques have been utilized before, their use has generally been limited to those applications wherein the voltage drop across the conducting transistor is either not critical or can be thereafter boosted through a subsequent amplification stage. Moreover, single device pass gates have not heretofore been utilized in conjunction with shift redundancy techniques.

SUMMARY OF THE INVENTION

The improved integrated circuit area efficient redundancy multiplexer circuit technique of the present invention disclosed herein advantageously provides similar functionality to conventional CMOS transmission, or "pass" gates while concomitantly reducing circuit complexity, the die area necessary to support redundant elements in memory device ICs and providing much reduced parasitic capacitance. The technique of the present invention effectuates this end by utilizing the on-chip boosted voltage levels ($V_{pp}$) which are generally available in such devices while the significant reduction provided in undesired parasitic capacitance enables higher throughput speeds in the address and data paths.

In a particular embodiment of the present invention disclosed herein, a single N-channel pass transistor uses the $V_{pp}$ voltage level (which is boosted above the normal supply voltage level of $V_{cc}$) to supply the voltage for the control signal applied to the N-channel transistor gate. The voltage level $V_{pp}$ and circuit ground ("GND") are then utilized as the logic "high" and "low" signal levels respectively. This use is made possible due to the fact that these control signals operate at a direct current ("DC") level after device power-up. When the integrated circuit device has come up and is stabilized (and after the redundancy has been programmed), then the signal levels of the N-channel pass gates are stabilized.

Particularly disclosed herein is an integrated circuit device having a supply voltage level applied thereto relative to a reference voltage level and a boosted voltage level greater than the supply voltage level. The device includes a redundancy multiplexer circuit which comprises a plurality of switching devices, with each of the switching devices coupled between a respective input signal line and a common output signal line. A plurality of control signal lines are also provided, with each of the control signal lines coupled to a control terminal of a corresponding one of the switching devices. The switching devices are operative in response to a control signal applied to the control terminal thereof at the boosted voltage level for passing an input signal on a corresponding input signal line to the output signal line without a threshold voltage drop thereacross.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
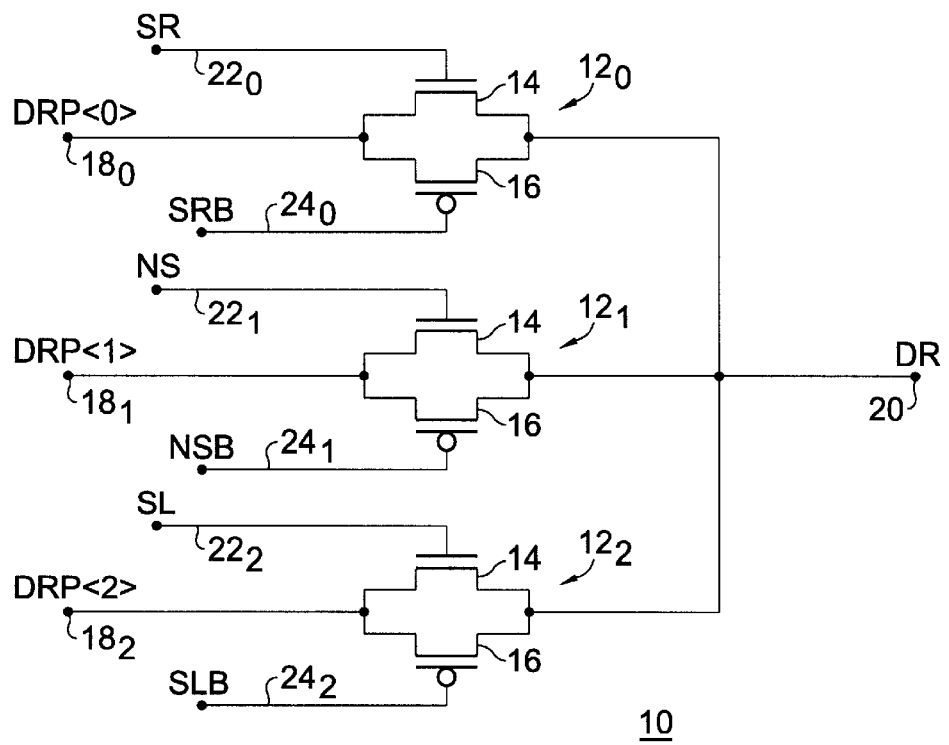
FIG. 1 is a gate level schematic illustration of a conventional integrated circuit redundancy multiplexer circuit.

With reference now to FIG. 1, a gate level schematic illustration of a conventional integrated circuit redundancy multiplexer circuit 10 is shown. The circuit 10 comprises a number of CMOS transmission, or "pass", gates $12_0$ through $12_2$, each of which comprises a pair of parallel coupled N-channel transistor 14 and P-channel transistor 16. In addition to the on-chip area required by the active devices themselves, complementary control signals must be routed to the gates of the N-channel transistor 14 and P-channel transistor 16 of each of the CMOS pass gates $12_0$ through $12_2$. For example, the signal SR ("shift right") must be applied to gate control line $22_0$ while its complement, SRB (SR "bar") must be applied to gate control line $24_0$. In like manner, the signal NS ("no shift") must be applied to gate control line $22_1$ while its complement, NSB (NS "bar") must be applied to gate control line $24_1$ while the signal SL ("shift left") must be applied to gate control line $22_2$ while its complement, SLB (SL "bar") must be applied to gate control line $24_2$.

In this manner, and depending on the state of the complementary control signals applied to the gate control lines $22_0$–$22_2$ and $24_0$–$24_2$, a selected one of the signals DRP<0>, DRP<1> or DRP<2> on input lines $18_0$ through $18_2$ respectively may be passed to the output line 20 ("DR") Functionally, if the gate voltage of the N-channel transistor 14 is at a logic level "zero" (or circuit ground "GND), then the complementary gate voltage to the corresponding P-channel transistor 16 will be at a logic level "one" (or at the supply voltage level of VCC) and both or the N-channel and P-channel transistors 14, 16 are in a non-conducting state. Alternatively, if the gate voltage of the N-channel transistor 14 is at a logic level "one" and the gate voltage of the corresponding P-channel transistor 16 is at a complementary logic level "zero", both transistors are in a conducting state.

In those instances wherein the gate voltage to the N-channel transistor 14 is at or near the supply voltage level of $V_{cc}$, there is a threshold voltage drop of $V_t$ across the N-channel transistor 14, but virtually no voltage drop across the P-channel transistor 16. On the other hand, if the gate voltage is near GND, the N-channel transistor 14 exhibits almost no voltage drop. Stated another way, an N-channel transistor 14 is operative to conduct a logic level "zero" with almost no voltage drop but typically introduces a $V_t$ drop to a logic level "one", hence the need for the parallel coupled P-channel transistor 16 which conducts the latter logic level with almost no voltage drop.

In the particular embodiment of the circuit 10 shown, the N-channel transistors 14 may have a channel width of 1.0μ while the P-channel transistors 16 may have a corresponding channel width of 2.0μ.

Figure 2:
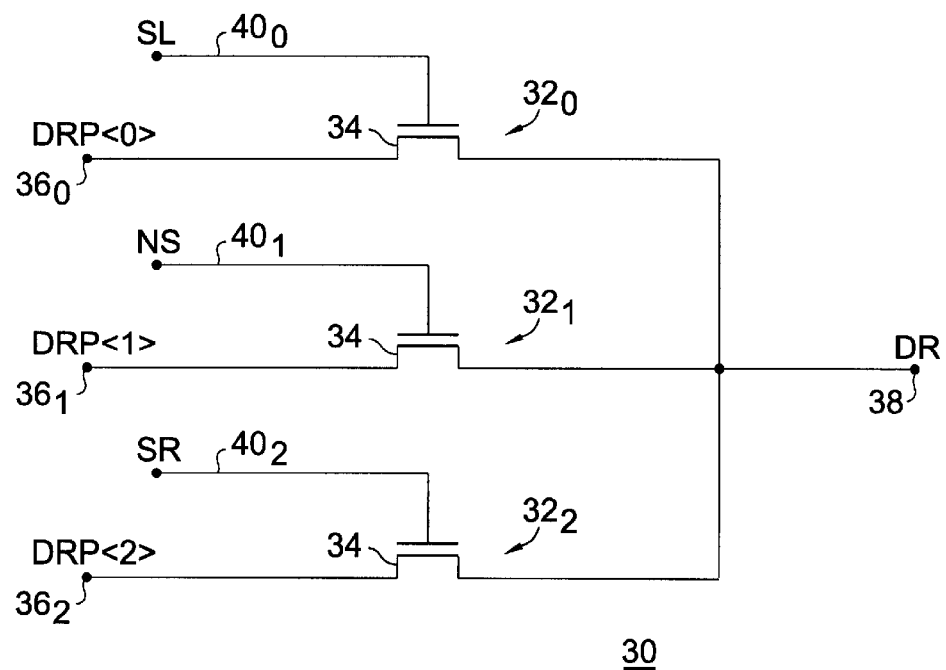
FIG. 2 is a corresponding gate level schematic illustration of an integrated circuit area efficient multiplexer circuit in accordance with an embodiment of the present invention.
Figure 3:
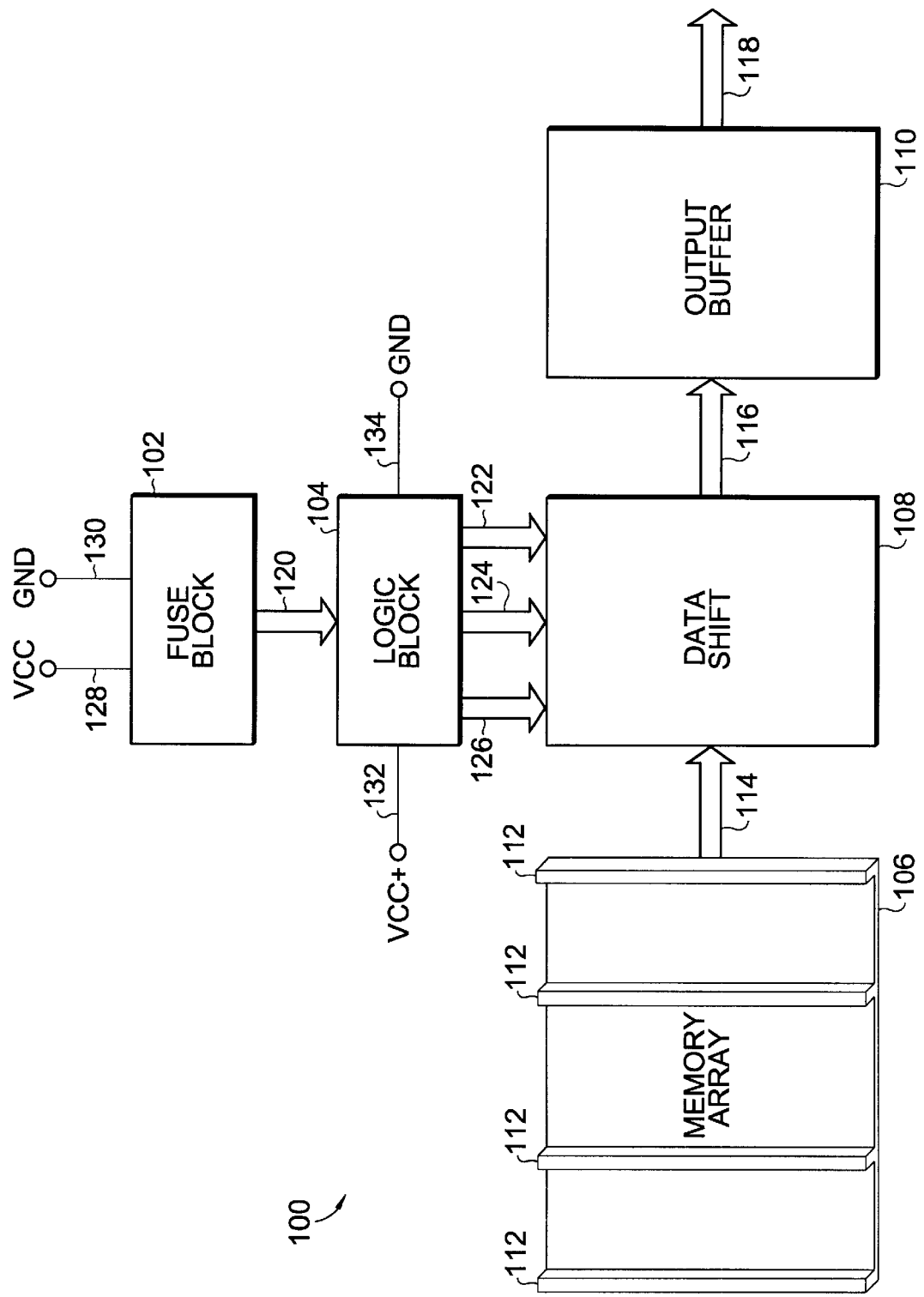
FIG. 3 is a block diagram of a self-correcting memory circuit including a memory array, a data-correcting shift redundancy circuit, an output buffer circuit, a fuse block, and a voltage boosting logic block, according to the present invention.

With reference additionally now to FIG. 2, a corresponding gate level schematic illustration of an integrated circuit area efficient multiplexer circuit 30 in accordance with an embodiment of the present invention is shown. In the particular implementation shown, the circuit 30 incorporates a plurality of pass gates $32_0$ through $32_2$ although any number "n" of such pass gates 32 may be included depending on the integrated circuit device design. Each of the pass gates $32_0$ through $32_2$ comprises but a single N-channel transistor 34 thereby obviating the layout and on-chip area required of a corresponding P-channel device and routing of complementary control signals as in the conventional circuit 10 (FIG. 1). The single device pass gates $32_0$ through $32_2$ also provide much improved parasitic capacitance characteristics over the conventional circuit 10 as will be more fully described hereinafter.

Each of the pass gates $32_0$ through $32_2$ have a single gate terminal coupled to a corresponding control line $40_0$ through $40_2$ (labeled as SL, NS and SR respectively). When one of the control lines $40_0$ through $40_2$ is activated at a level of $V_{pp}$ (boosted above the supply voltage level of $V_{cc}$), the corresponding one of the input signals on input lines $36_0$ through $36_2$ (DRP<0> through DRP<2> respectively) is then passed to the output line 38 ("DR") without a $V_t$ voltage drop across the N-channel transistor 34. In the embodiment of the circuit 30 shown, the N-channel transistors 34 may have a channel width of substantially 1.0μ and a corresponding channel length of substantially 0.34μ. Typically, the voltage level for the boosted voltage level $V_{pp}$ will be from substantially 1.5 to 2.2 times that of the supply voltage level $V_{cc}$. In the implementation of the circuit 30 shown, $V_{cc}$ would be a nominal 1.5 volts while $V_{pp}$ is approximately 3.3 volts.

In general, for proper circuit 30 operation, $V_{pp}$ should be a "body effected" $V_t$ above the level of $V_{cc}$ or greater. In a typical implementation of the present invention in conjunction with a memory device, such as a DRAM or other device with embedded memory, the level of $V_{pp}$ will meet this criteria since the primary function of $V_{pp}$ is to provide a sufficiently high power supply source for the wordlines to use so that a full logic level "one" can be stored in a given memory cell which typically employs but a single N-channel pass gate transistor.

While the actual on-chip real estate savings afforded by the circuit 30 of the present invention may appear to be relatively small over that of the conventional circuit 10 (FIG. 1), the actual savings in die area are dependent upon several factors including the memory array density, the amount of redundancy employed and the total input/output (I/O) width.

The circuit 30 nevertheless provides a significant improvement in undesired parasitic capacitance over the conventional circuit 10 (FIG. 1). With respect to the circuit 10 of FIG. 1 particularly, it can be seen that the output line 20 (DR) will experience all of the "on" N-channel transistor 14 and P-channel transistor 16 gate capacitance for each selected path of the pass gates 120 through 122. For example, if no shift is selected, the signal NS on line $22_1$ will be "high"; the signal NSB on line $24_1$ will be "low" while the signals SR and SL on lines 220 and $22_2$ will be "low" and the signals SRB and SLB on lines $24_0$ and $24_2$ will be "high". In this instance, the output node 20 and the DRP<1> signal on input line $18_1$ will have to drive the full gate capacitance of N-channel transistor 14 and P-channel transistor 16 of pass gate $12_1$ as well as the junction capacitance of both transistors of the pass gates $12_0$ and $12_2$.

The circuit 30 obviates the need for parallel coupled P-channel transistors altogether thereby eliminating totally their gate and source/drain capacitances altogether. Since P-channel transistors are typically sized with gate widths twice the size of N-channel transistors due to their channel mobility, this reduces the amount of capacitance that needs to be driven by more than half of that of the circuit 10. In a comparative situation to that previously described, the signal NS on input line $40_1$ will be at VPP (logic "high") while the signals SL and SR on input lines $40_0$ and $40_2$ will both be at a logic "low" level, or GND. In this instance, the signals DRP<1> on input line $36_1$ and DR on output line 38 now only have to drive the gate capacitance of the N-channel transistor 34 of pass gate $32_1$ and the source/drain capacitance of the N-channel transistors 34 of pass gates $32_0$ and $32_2$.

Referring generally to FIGS. 3–10, a self-correcting memory 100 is shown having a memory array 106 including rows and columns of DRAM or other memory cells, sense amplifier columns 112, an error-correcting data shifter or shift redundancy circuit 108, an output buffer circuit 110, a fuse block 102, and a voltage boosting logic block 104. Other routine circuit elements as are known to those skilled in memory design are not shown in FIG. 3 such as row and column decoders, and other data control circuitry. A data bus 114 transports raw uncorrected data and one or more spare bits to shift redundancy circuit 108. The corrected output data is transported via bus 116 to output buffer circuit 110. The data is buffered and provided to external pins via data bus 118. A fuse block 102 is used to program a data pattern which is transported via bus 120 to logic block 104. The boosted and decoded data pattern is transported via shift-left bus 126, no-shift bus 124, and shift-right bus 122 to shift redundancy circuit 108, as is described in further detail below.

Shift redundancy circuit 108 may also be referred to as an "error-correcting circuit" or a "data shifter" or a "data shifting circuit". The operation of shift redundancy circuit 108 is different from an ordinary shift register circuit in that the output data may be partially shifted by one bit to the right for a portion of the output data word, partially shifted by one bit to the left for portion of the output data word, or not shifted at all for a portion of the data word, or any combination thereof. Also, as explained in greater detail below, since the N-channel transistors used to fabricate shift redundancy circuit 108 have their gates driven to a boosted VCC+control voltage, the voltage loss between the input and the output of shift redundancy circuit 108 is minimized to essentially zero volts.

Figure 4:
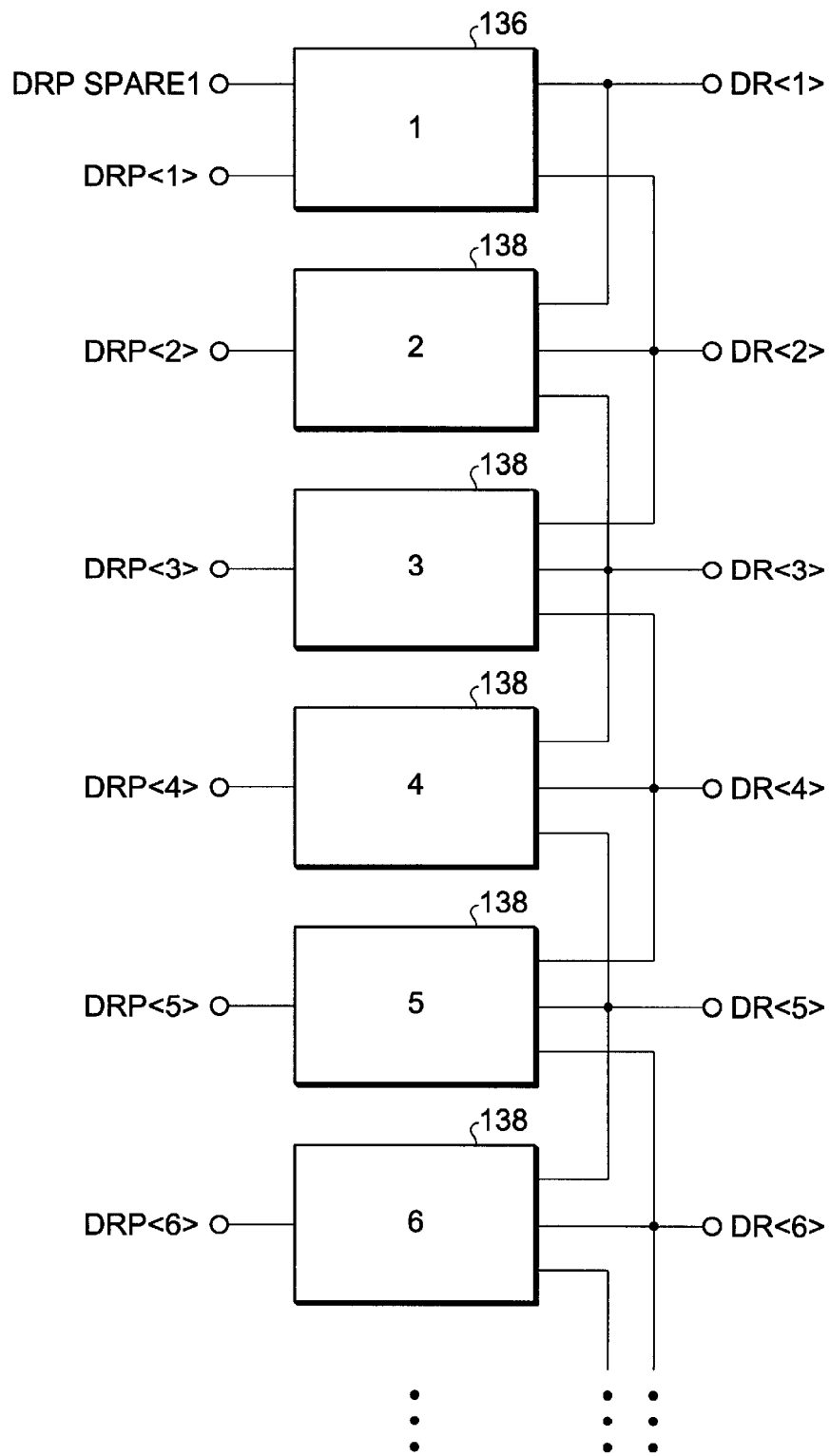
FIG. 4 is a block diagram of the shift redundancy circuit of FIG. 3, showing a series of interconnected multiplexers each having either one or two inputs for receiving uncorrected raw data or raw data and a spare bit, and two or three outputs for providing shifted or unshifted data to provide a corrected output data word according to the present invention.

Referring now to FIG. 4, shift redundancy circuit 108 includes a series of interconnected multiplexers 136 and 138 each having an input coupled to the shift redundancy circuit input, at least one output coupled to the shift redundancy circuit output, and at least one control terminal for receiving a programmed boosted DC control voltage. The control voltage input is not shown in FIG. 4 but is described in detail below. Only the first six multiplexers are shown and are sequentially labeled. Any number required by the input data word may be used. The input of shift redundancy circuit 108 is shown for reading an input data word having N bits. The individual input bits are labeled DRP<1> through DRP<6>. The other input bits, up to the total of N input bits, N multiplexers, and N sets of output connections are not shown in FIG. 4, but are built according to the pattern shown in FIG. 4 up to the total number N desired. Two "spare bits" are also provided to replace data that may be lost in a damaged row of the memory array, but only the first spare bit input DRP SPARE1 is shown. A second spare bit is associated with the last multiplexer in the series, as is described in greater detail below. The first multiplexer 136 has two inputs for receiving input data and the first spare bit. All other multiplexers 138 each have a single input for receiving a single data input bit. The first multiplexer 136 and last multiplexer 140 (not shown in FIG. 4) each have two outputs. All other multiplexers 138 each have three outputs, with "shift-left" <N−1>, "no-shift" <N>, and "shift-right" <N+1> outputs being coupled to adjacent multiplexers 138 as illustrated in FIG. 4.

Figure 5:
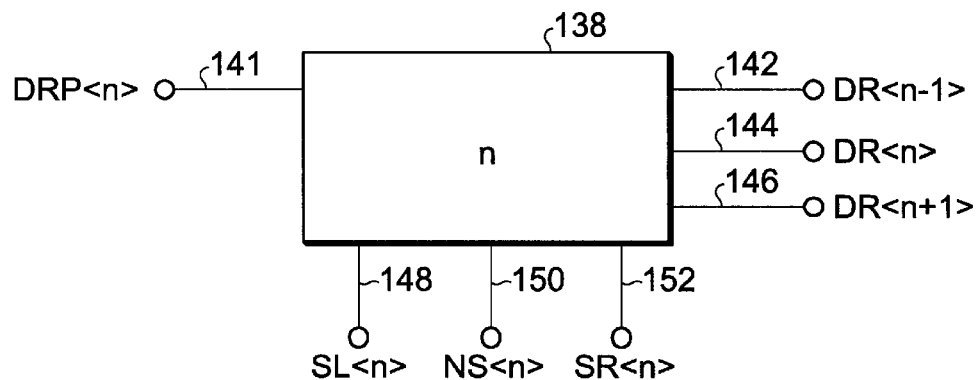
FIG. 5 is a block representation of an intermediary $n^{th}$ multiplexer of the series shown in FIG. 4.

Referring now to FIG. 5, each n th multiplexer 138 in the series includes an input 141 for receiving a $n^{th}$ data bit, a first output 142 for providing an $(n-1)^{th}$ data bit, a second output 144 for providing an $n^{th}$ data bit, a third output 146 for providing an $(n+1)^{th}$ data bit, a first control terminal 152 for receiving a shift-right control voltage, a second control terminal 150 for receiving a no-shift control voltage, and a third control terminal 148 for receiving a shift-left control voltage. As is explained in further detail below, the control voltages are boosted DC voltages that are boosted to a voltage greater than the memory power supply voltage, and are programmed according to a preset pattern as desired to route the input signal to the appropriate output terminal to correct a possible memory row or bit error.

Figure 6:
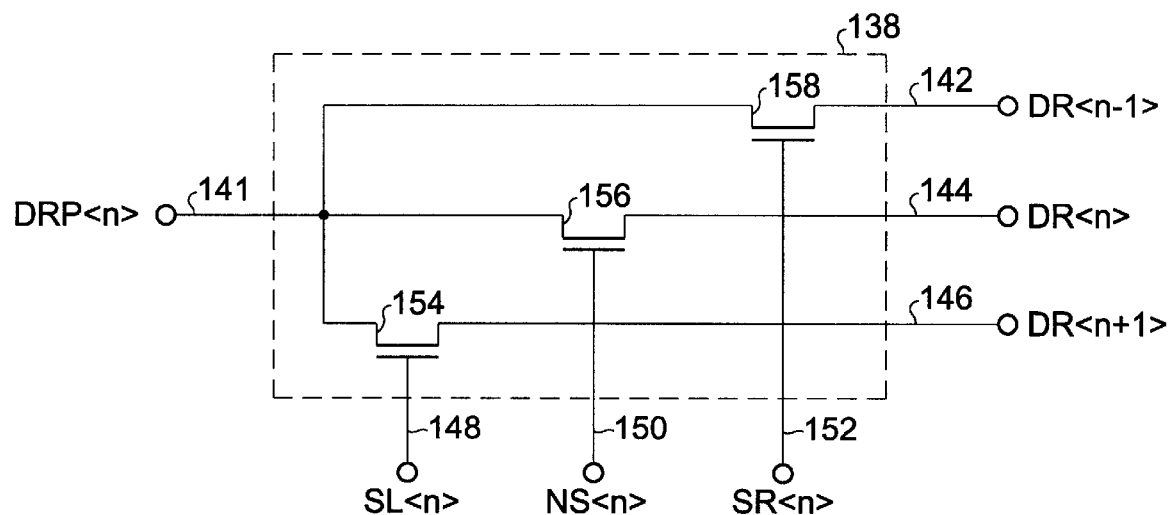
FIG. 6 is a transistor-level schematic of the $n^{th}$ multiplexer of FIG. 5.

Referring now to FIG. 6, multiplexer 138 further includes a first transistor 158 having a current path coupled between the input 141 and the first output 142, and a gate coupled to the first control terminal 152, a second transistor 156 having a current path coupled between the input 141 and the second output 144, and a gate coupled to the second control terminal 150, and a third transistor 154 having a current path coupled between the input 140 and the third output 146, and a gate coupled to the third control terminal 148. Each of the first, second, and third transistors 158, 156, and 154 are N-channel transistors. Since the DC gate voltages are boosted above the standard power supply voltage, the voltage drop across each of the transistors is minimized, and is essentially equal to a zero volt drop.

Figure 7:
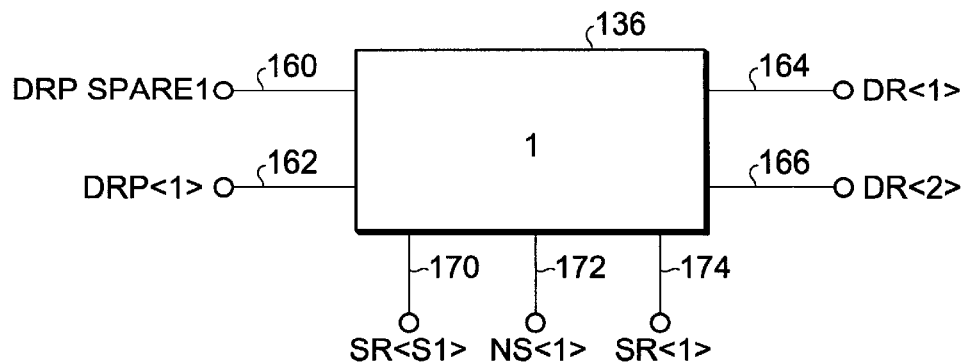
FIG. 7 is a block representation of a first multiplexer of FIG. 4.

Referring now to FIG. 7, multiplexer 136 includes a first input 162 for receiving a first data bit, a second input 160 for receiving a spare data bit, a first output 164 for providing a DR<1> data bit, and a second output 166 for providing a DR<2> data bit. Multiplexer 136 also includes a first control terminal 174 for receiving a first shift-right control voltage, a second control terminal 172 for receiving a no-shift control voltage, and a third control terminal 170 for receiving a second shift-right control voltage to shift the spare bit as required.

Figure 8:
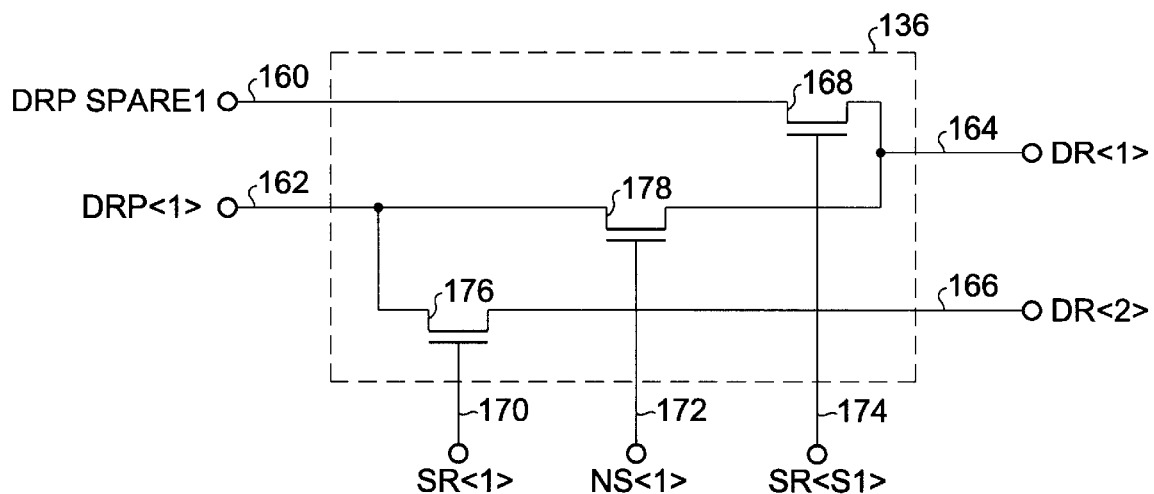
FIG. 8 is a transistor-level schematic of first multiplexer of the series shown in FIG. 4.

Referring now to FIG. 8, multiplexer 136 further includes a first transistor 168 having a current path coupled between the second input 160 and the first output 164, and a gate coupled to the first control terminal 174, a second transistor 178 having a current path coupled between the first input 162 and the first output 164, and a gate coupled to the second control terminal 172, and a third transistor 176 having a current path coupled between the first input 162 and the second output 166, and a gate coupled to the third control terminal 170. Each of the first, second, and third transistors 168, 178, and 176 are N-channel transistors.

Figure 9:
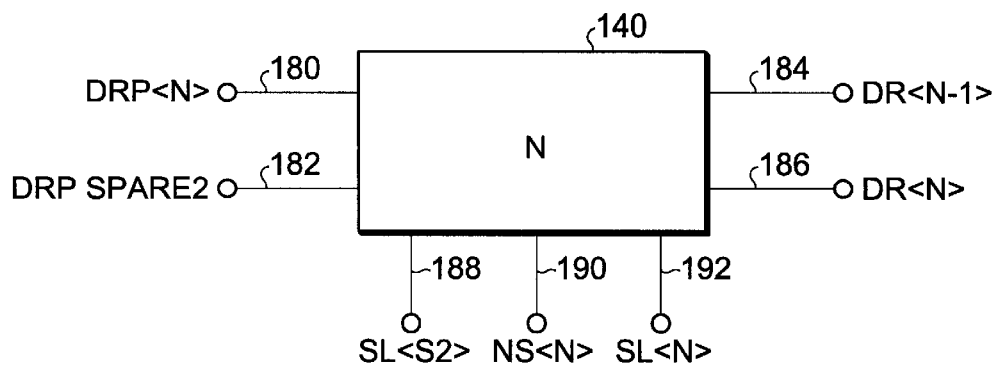
FIG. 9 is a block representation of a last multiplexer.

Referring now to FIG. 9, a last multiplexer 140 in the series of multiplexers includes a first input 180 for receiving a last data bit DRP<N>, a second input 182 for receiving a spare data bit DRP SPARE2, a first output 184 for providing a next-to-last data bit DR<N−1>, and a second output 186 for providing a last data bit DR<N>. Multiplexer 140 further includes a first control terminal 192 for receiving a first shift-left control voltage, a second control terminal 190 for receiving a no-shift control voltage, and a third control terminal 188 for receiving a second shift-left control voltage.

Figure 10:
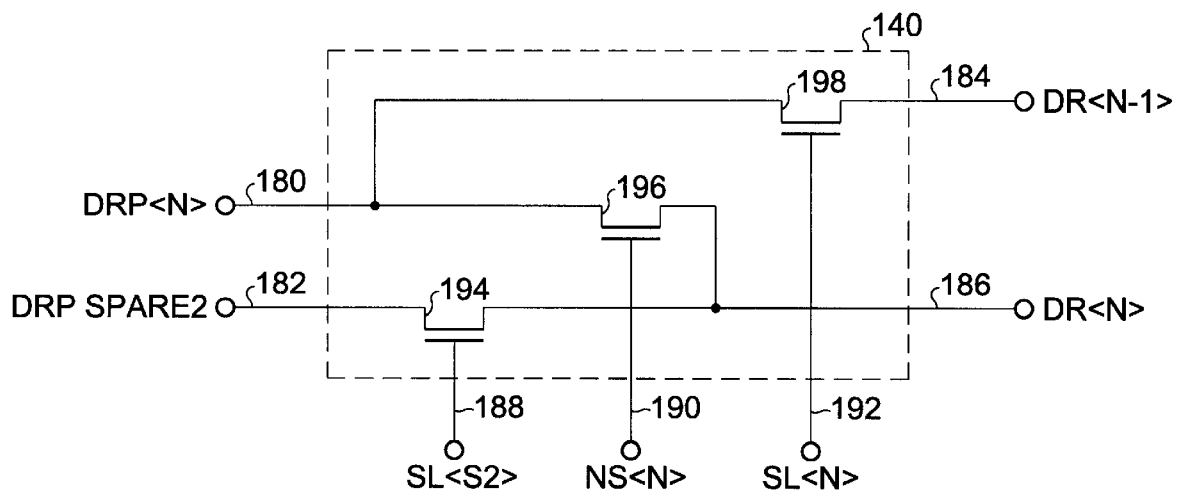
FIG. 10 is a transistor-level schematic of the last multiplexer of FIG. 9.

Referring now to FIG. 10, multiplexer 140 further includes a first transistor 198 having a current path coupled between the first input 180 and the first output 184, and a gate coupled to the first control terminal 192, a second transistor 196 having a current path coupled between the first input 180 and the second output 186, and a gate coupled to the second control terminal 190, and a third transistor 194 having a current path coupled between the second input 182 and the second output 186, and a gate coupled to the third control terminal 188. The first, second, and third transistors 198, 196, and 194 are N-channel transistors.

As in the intermediary multiplexers 138, the first multiplexer 136 and last multiplexer 140 both received boosted, programmed DC control voltages for left or right shifting, or no shifting, as is explained in greater detail below.

Returning again to FIG. 3, the shift redundancy circuit 108 is coupled to a fuse block 102, which contains a number of programmed fuses for generating a predetermined data pattern, through a logic block 104 for boosting and converting the data pattern into the shift-left, no-shift, and shift-right control voltages. Fuse block 102 includes a number of fuses that are programmed during an initial testing phase and are either opened or closed as is known in the art to create the initial data pattern transferred on bus 120. The fuse block 102 is powered through a first power terminal 128 for receiving an unboosted power supply voltage such as 3.3 volts, or five volts, or another standard power supply voltage level, as well as a second power terminal 130 that is coupled to ground. The logic block 104 further includes conventional CMOS or other digital circuitry for logically converting the data pattern on bus 120 to the desired predetermined shift-left data pattern on bus 126, the desired predetermined no-shift data pattern on bus 124, and the desired shift-right data pattern on bus 122. Logic block 104 includes a first power terminal 132 for receiving a boosted power supply voltage greater than the unboosted VCC power supply voltage cited above, as well as a second power terminal 134 coupled to ground. The logic gates or transistors inside of logic block 104 would thus be powered by a boosted VCC+ supply voltage and ground and would thus provide boosted DC control voltages to the shift redundancy circuit 108. Finally an output buffer 110 is used for buffering the shift redundancy circuit output bus 116 to provide a buffered, error-corrected, data output bus 118.

In operation, at wafer level testing, a memory wafer is read and any memory errors are stored in a register. Fuses in fuse block 102 are either blown, or metal-mask programmed, or otherwise programmed as is known in the art. The wafer is then subjected to further environmental and performance tests, and is then packaged normally and shipped to the customer.

While there have been described above the principles of the present invention in conjunction with specific device types, dimensions and circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A data shifting circuit for use in an error-correcting memory comprising:

a data shifting circuit input for receiving uncorrected data and at least one spare bit;

a data shifting circuit output for providing corrected data; and a plurality of interconnected multiplexers each having an input coupled to the data shifting circuit input, at least one output coupled to the data shifting circuit output, and at least one control terminal for receiving a programmed boosted DC control voltage.

2. The data shifting circuit of claim 1 in which at least one of the multiplexers comprises:

an input for receiving a $n^{th}$ data bit;

a first output for providing an $(n-1)^{th}$ data bit;

a second output for providing an nthdata bit;

a third output for providing an $(n+1)^{th}$ data bit;

a first control terminal for receiving a shift-right control voltage;

a second control terminal for receiving a no-shift control voltage; and a third control terminal for receiving a shift-left control voltage.

3. The data shifting circuit of claim 2 in which the multiplexer further comprises:

a first transistor having a current path coupled between the input and the first output, and a gate coupled to the first control terminal;

a second transistor having a current path coupled between the input and the second output, and a gate coupled to the second control terminal; and a third transistor having a current path coupled between the input and the third output, and a gate coupled to the third control terminal.

4. The data shifting circuit of claim 3 in which the first, second, and third transistors each comprise an N-channel transistor.

5. The data shifting circuit of claim 1 in which a first of the multiplexers comprises:

a first input for receiving a first data bit;

a second input for receiving a spare data bit;

a first output for providing a first data bit;

a second output for providing a second data bit;

a first control terminal for receiving a first shift-right control voltage;

a second control terminal for receiving a no-shift control voltage; and a third control terminal for receiving a second shift-right control voltage.

6. The data shifting circuit of claim 5 in which the multiplexer further comprises:

a first transistor having a current path coupled between the second input and the first output, and a gate coupled to the first control terminal;

a second transistor having a current path coupled between the first input and the first output, and a gate coupled to the second control terminal; and a third transistor having a current path coupled between the first input and the second output, and a gate coupled to the third control terminal.

7. The data shifting circuit of claim 6 in which the first, second, and third transistors each comprise an N-channel transistor.

8. The data shifting circuit of claim 1 in which a last of the multiplexers comprises:
- a first input for receiving a last data bit;
- a second input for receiving a spare data bit;
- a first output for providing a next-to-last data bit;
- a second output for providing a last data bit;
- a first control terminal for receiving a first shift-left control voltage;
- a second control terminal for receiving a no-shift control voltage; and
- a third control terminal for receiving a second shift-left control voltage.

9. The data shifting circuit of claim 8 in which the multiplexer further comprises:
- a first transistor having a current path coupled between the first input and the first output, and a gate coupled to the first control terminal;
- a second transistor having a current path coupled between the first input and the second output, and a gate coupled to the second control terminal; and
- a third transistor having a current path coupled between the second input and the second output, and a gate coupled to the third control terminal.

10. The data shifting circuit of claim 9 in which the first, second, and third transistors each comprise an N-channel transistor.

11. The data shifting circuit of claim 1 further comprising:
- a fuse block containing a plurality of programmed fuses for generating a predetermined data pattern; and
- a logic block for boosting and converting the data pattern into the shift-left, no-shift, and shift-right control voltages.

12. The data shifting circuit of claim 11 in which the fuse block further comprises:
- a first power terminal for receiving an unboosted power supply voltage; and
- a second power terminal coupled to ground.

13. The data shifting circuit of claim 11 in which the logic block further comprises:
- a first power terminal for receiving a boosted power supply voltage; and
- a second power terminal coupled to ground.

14. The data shifting circuit of claim 1 further comprising an output buffer for buffering the data shifting circuit output.

15. A data shifting circuit for use in an error-correcting memory comprising:
- a data shifting circuit input coupled to an uncorrected data bus;
- a data shifting circuit output coupled to a corrected data bus; and
- a plurality of interconnected multiplexers each having an input coupled to the data shifting circuit input, at least one output coupled to the data shifting circuit output, and at least one control terminal for receiving a programmed boosted DC control voltage.

16. The data shifting circuit as in claim 15 in which at least one of the multiplexers further comprises:
- a first control terminal for receiving a first shift-left control voltage;
- a second control terminal for receiving a no-shift control voltage; and
- a third control terminal for receiving a second shift-left control voltage.

17. The data shifting circuit of claim 15 in which each of the multiplexers comprises first, second, and third N-channel transistors.

18. The data shifting circuit of claim 15 in which the programmed boosted DC control voltages are boosted to a voltage greater than a memory supply voltage.

19. The data shifting circuit of claim 15 further comprising:
- a fuse block for providing a data pattern; and
- a logic block for boosting and converting the data pattern into the programmed boosted DC control voltages.

20. A data shifting circuit for use in an error-correcting memory comprising:
- a data shifting circuit input for receiving uncorrected data and at least one spare bit;
- a data shifting circuit output for providing corrected data; and
- a plurality of interconnected N-channel transistor multiplexers each having an input coupled to the data shifting circuit input, at least one output coupled to the data shifting circuit output, and at least one control terminal for receiving a programmed boosted DC data-shifting control voltage.

* * * * *

UNITED STATES PATENT AND TRADEMARK OFFICE
CERTIFICATE OF CORRECTION

PATENT NO. : 6,501,817 B2
DATED : December 31, 2002
INVENTOR(S) : Michael Parris and Kim Hardee It is certified that error appears in the above-identified patent and that said Letters Patent is hereby corrected as shown below:

Column 8,
Line 23, "nthdata" should be -- $n^{th}$ data --

Signed and Sealed this

Eighteenth Day of March, 2003

JAMES E. ROGAN
*Director of the United States Patent and Trademark Office*